(12) United States Patent
Guan et al.

(10) Patent No.: US 12,027,514 B2
(45) Date of Patent: Jul. 2, 2024

(54) CLAMPING CIRCUIT INTEGRATED ON GALLIUM NITRIDE SEMICONDUCTOR DEVICE AND RELATED SEMICONDUCTOR DEVICE

(71) Applicant: INNOSCIENCE (ZHUHAI) TECHNOLOGY CO., LTD., Zhuhai (CN)

(72) Inventors: Yaobin Guan, Zhuhai (CN); Jianjian Sheng, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 0 days.

(21) Appl. No.: 18/162,725

(22) Filed: Feb. 1, 2023

(65) Prior Publication Data

US 2023/0178541 A1  Jun. 8, 2023

Related U.S. Application Data

(63) Continuation of application No. 16/860,078, filed on Apr. 28, 2020, now Pat. No. 11,600,610.

(30) Foreign Application Priority Data

Jan. 7, 2020  (CN) .......................... 202010014156.0

(51) Int. Cl.
*H01L 27/02* (2006.01)
*H01L 23/31* (2006.01)
(Continued)

(52) U.S. Cl.
CPC ...... *H01L 27/0266* (2013.01); *H01L 23/3171* (2013.01); *H01L 27/0288* (2013.01);
(Continued)

(58) Field of Classification Search
CPC ..... H01L 27/02; H01L 27/06; H01L 27/0266; H01L 27/0288; H01L 27/0605;
(Continued)

(56) References Cited

U.S. PATENT DOCUMENTS

2020/0135722 A1* 4/2020 Chern ................. H01L 21/8252

* cited by examiner

*Primary Examiner* — Chuong A Luu
(74) *Attorney, Agent, or Firm* — Li & Cai Intellectual Property (USA) Office

(57) ABSTRACT

A semiconductor device and a clamping circuit including a substrate; a first semiconductor layer, arranged on the substrate and composed of a III-nitride semiconductor material; a second semiconductor layer, arranged on the first semiconductor layer and composed of a III-nitride semiconductor material; a power transistor structure, including a gate structure, a drain structure and a source structure arranged on the second semiconductor layer; the first transistor structures, arranged on the second semiconductor layer; and the second transistor structures, arranged on the second semiconductor layer in series. One end of the first transistor structures and one end of the second transistor structures are jointly electrically connected to the drain structure of the power transistor structure, and the other end of the first transistor structures and the other end of the second transistor structures are jointly electrically connected to the source structure of the power transistor structure.

11 Claims, 8 Drawing Sheets

(51) Int. Cl.
    *H01L 27/06*          (2006.01)
    *H01L 29/20*          (2006.01)
    *H01L 29/205*        (2006.01)
    *H01L 29/778*        (2006.01)
    *H01L 49/02*          (2006.01)
    *H03K 17/082*        (2006.01)

(52) U.S. Cl.
    CPC ...... *H01L 27/0605* (2013.01); *H01L 27/0629* (2013.01); *H01L 28/20* (2013.01); *H01L 28/60* (2013.01); *H01L 29/2003* (2013.01); *H01L 29/205* (2013.01); *H01L 29/7786* (2013.01); *H03K 17/0822* (2013.01)

(58) Field of Classification Search
    CPC ..... H01L 27/0629; H01L 28/20; H01L 28/60; H01L 23/313171; H01L 29/20; H01L 29/205; H01L 29/778; H01L 29/2003; H01L 29/7786; H01L 27/0296; H01L 29/417; H01L 29/872; H01L 29/41766; H03K 17/082; H03K 17/0822
    USPC ................................................ 257/107, 189
    See application file for complete search history.

CLAMPING CIRCUIT INTEGRATED ON GALLIUM NITRIDE SEMICONDUCTOR DEVICE AND RELATED SEMICONDUCTOR DEVICE

CROSS REFERENCE TO RELATED APPLICATIONS

This application is a continuation application of U.S. application Ser. No. 16/860,078, filed on Apr. 28, 2020, which claims the benefit of priority from the China Patent Application No. 202010014156.0 filed on Jan. 7, 2020, the disclosure of which is hereby incorporated by reference in its entirety.

BACKGROUND OF THE INVENTION

1. Field of the Invention

The present invention relates to a clamping circuit, and more particularly to a clamping circuit integrated on a gallium nitride semiconductor device and a related semiconductor device.

2. Description of the Related Art

Wide bandgap semiconductor materials generally have higher critical avalanche breakdown electric field intensity and carrier saturation drift speed than silicon semiconductor materials, and also have higher thermal conductivity. Therefore, electronic devices based on the wide bandgap semiconductor materials (such as silicon carbide) have relatively high breakdown voltage, relatively low on-resistance and relatively small device dimension.

It is generally recognized that the wide bandgap semiconductor materials have great potential for breaking the limits of power metal oxide semiconductor field effect transistors (MOSFETs) in power conversion and radio frequency applications.

SUMMARY OF THE INVENTION

A power device based on a wide bandgap semiconductor, such as a gallium nitride (GaN) high-electron-mobility transistor (HEMT), uses a polarization effect to form high-concentration two-dimensional electron gas to realize electric conduction. Different from the principle of a complementary metal oxide semiconductor (CMOS) process, the GaN HEMT does not have a parasitic body diode, and input and output capacitance is lower. Therefore, compared with a conventional CMOS, the GaN HEMT needs an additional protection mechanism.

Some embodiments of the present invention provide a semiconductor device, including: a substrate; a first semiconductor layer, arranged on the substrate and composed of a III-nitride semiconductor material; a second semiconductor layer, arranged on the first semiconductor layer and composed of a III-nitride semiconductor material; a power transistor structure, including a gate structure, a drain structure and a source structure arranged on the second semiconductor layer; one or more first transistor structures, arranged on the second semiconductor layer; and one or more second transistor structures, arranged on the second semiconductor layer in series. One end of the one or more first transistor structures and one end of the one or more second transistor structures are jointly electrically connected to the drain structure of the power transistor structure, and the other end of the one or more first transistor structures and the other end of the one or more second transistor structures are jointly electrically connected to the source structure of the power transistor structure.

Some other embodiments of the present invention provide a semiconductor device, including: a power device, including a gallium nitride (GaN) transverse high-electron-mobility transistor (HEMT), the HEMT having a first terminal, a second terminal and a control terminal; and a clamping circuit, connected to the first terminal and the second endpoint of the power device, the clamping circuit including: a voltage detection circuit, having a first terminal, a second terminal and a third terminal, the first terminal of the voltage detection circuit being electrically connected to the first terminal of the power device, and the third terminal of the voltage detection circuit being electrically connected to the second terminal of the power device; and a switching circuit, having a first terminal, a second terminal and a control terminal, the first terminal of the switching circuit being electrically connected to the first terminal of the voltage detection circuit, the control terminal of the switching circuit being electrically connected to the second terminal of the voltage detection circuit, and the second terminal of the switching circuit being electrically connected to the third terminal of the voltage detection circuit. The power device and the clamping circuit are jointly integrated on a GaN process platform. When voltage on the first terminal of the voltage detection circuit is greater than a first threshold, the voltage detection circuit turns on the first terminal and the second terminal of the switching circuit through the control terminal of the switching circuit.

Some more embodiments of the present invention provide a clamping circuit, connected to a first terminal and a second terminal of a power device. The clamping circuit includes: a voltage detection circuit, having a first terminal, a second terminal and a third terminal, the first terminal of the voltage detection circuit being electrically connected to the first terminal of the power device, and the third terminal of the voltage detection circuit being electrically connected to the second terminal of the power device; and a switching circuit, having a first terminal, a second terminal and a control terminal, the first terminal of the switching circuit being electrically connected to the first terminal of the voltage detection circuit, the control terminal of the switching circuit being electrically connected to the second terminal of the voltage detection circuit, and the second terminal of the switching circuit being electrically connected to the third terminal of the voltage detection circuit. The power device includes a gallium nitride (GaN) transverse high-electron-mobility transistor (HEMT), and the power device and the clamping circuit are jointly integrated on a GaN process platform. When voltage on the first terminal of the voltage detection circuit is greater than a first threshold, the voltage detection circuit turns on the first terminal and the second terminal of the switching circuit through the control terminal of the switching circuit.

BRIEF DESCRIPTION OF THE DRAWINGS

The aspects of the present invention will become more comprehensible from the following detailed description made with reference to the accompanying drawings. It should be noted that, various features may not be drawn to scale. Actually, the sizes of the various features may be increased or reduced arbitrarily for the purpose of clear description.

PREFERRED EMBODIMENT OF THE PRESENT INVENTION

Figure 1:
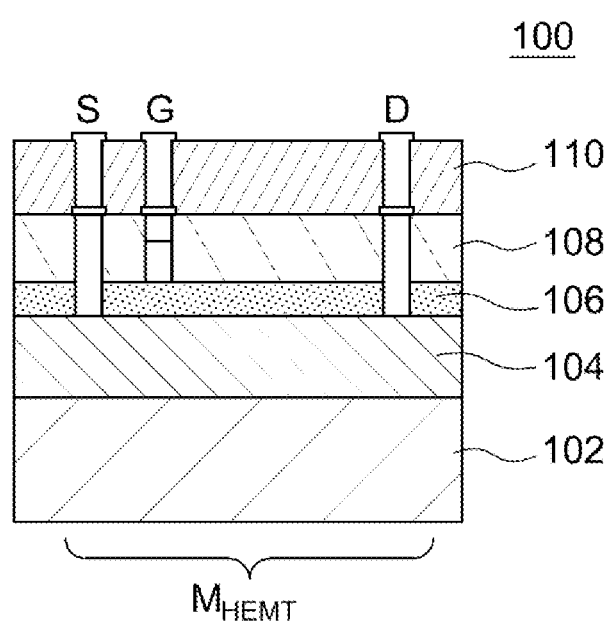
FIG. 1 is a side view of a semiconductor device according to one embodiment of the present invention.

The following disclosure provides many different embodiments or examples for implementing different features of the provided subject matter. Specific examples of components and arrangements are described below. Certainly, these descriptions are merely examples and are not intended to be limiting. In the present invention, in the following descriptions, the description of the first feature being formed on or above the second feature may include an embodiment formed by direct contact between the first feature and the second feature, and may further include an embodiment in which an additional feature may be formed between the first feature and the second feature to enable the first feature and the second feature to be not in direct contact. In addition, in the present invention, reference numerals and/or letters may be repeated in examples. This repetition is for the purpose of simplification and clarity, and does not indicate a relationship between the described various embodiments and/or configurations.

The embodiments of the present invention are described in detail below. However, it should be understood that many applicable concepts provided by the present invention may be implemented in a plurality of specific environments. The described specific embodiments are only illustrative and do not limit the scope of the present invention.

FIG. 1 is a side view of one embodiment of a semiconductor device according to the present invention. The semiconductor device 100 of FIG. 1 includes a gallium nitride (GaN) transverse high-electron-mobility transistor (HEMT) MHEMT including a substrate 102, semiconductor layers 104 and 106, and passivation layers 108 and 110.

According to some embodiments of the present invention, the substrate 102 may include, for example, but not limited to, silicon (Si), doped Si, silicon carbide (SiC), germanium silicide (SiGe), gallium arsenide (GaAs), or other semiconductor materials. According to some embodiments of the present invention, the substrate 102 may also include, for example, but not limited to, sapphire, silicon on insulator (SOI) or other suitable materials. In some embodiments, the substrate 102 may further include a doped region (not marked in FIG. 1), such as p-well and n-well.

According to some embodiments of the present invention, the semiconductor layer 104 may include a III-V material. According to some embodiments of the present invention, the semiconductor layer 104 may include, but not limited to, III nitrides, such as, but not limited to, GaN, AN, InN and a compound $In_xAl_yGa_{1-x-y}N$ where x+y is less than or equal to 1, or a compound $Al_yGa_{(1-y)}N$ where y is less than or equal to 1. According to some embodiments of the present invention, the semiconductor layer 106 may include a III-V material. According to some embodiments of the present invention, the semiconductor layer 106 may include, but not limited to, III nitrides, such as, but not limited to, GaN, AN, InN and a compound $In_xAl_yGa_{1-x-y}N$ where x+y is less than or equal to 1, or a compound $Al_yGa_{(1-y)}N$ where y is less than or equal to 1. The semiconductor layers 104 and 106 may form heterojunctions. The polarization of the heterojunctions of different nitrides may form two-dimensional electron gas (2DEG) (not marked in FIG. 1) on interfaces of the semiconductor layers 104 and 106.

According to some embodiments of the present invention, the passivation layers 108 and 110 may include dielectric materials. For example, the passivation layers 108 and 110 may include, but not limited to, silicon nitride ($SiN_x$), silicon dioxide ($SiO_2$), $Al_2O_3$, or $HfO_2$.

According to some embodiments of the present invention, the GaN transistor $M_{HEMT}$ further includes a gate structure G, a drain structure D and a source structure S respectively arranged on the semiconductor layer 106. The GaN transistor $M_{HEMT}$ is turned on or turned off according to changes of an input signal of a gate thereof. Since a drain of the GaN transistor $M_{HEMT}$ has a parasitic inductor Lp, when the GaN transistor $H_{HEMT}$ is turned off, the parasitic inductor Lp releases energy stored therein. Since the GaN transistor $H_{HEMT}$ is not protected by a body diode like a conventional complementary metal oxide semiconductor (CMOS), the energy of the parasitic inductor Lp completely falls onto an equivalent capacitor between a source and the drain of the GaN transistor $M_{HEMT}$. By this time, voltage of the drain would rise, and very easily exceed breakdown voltage of the GaN transistor $M_{HEMT}$, and thus causes damage to the GaN transistor $M_{HEMT}$.

Therefore, it is necessary to provide a clamping circuit between the source and the drain of the GaN transistor $M_{HEMT}$, so as to avoid the voltage of the drain from being too high and to not affect normal switching work of the circuit.

Figure 2:
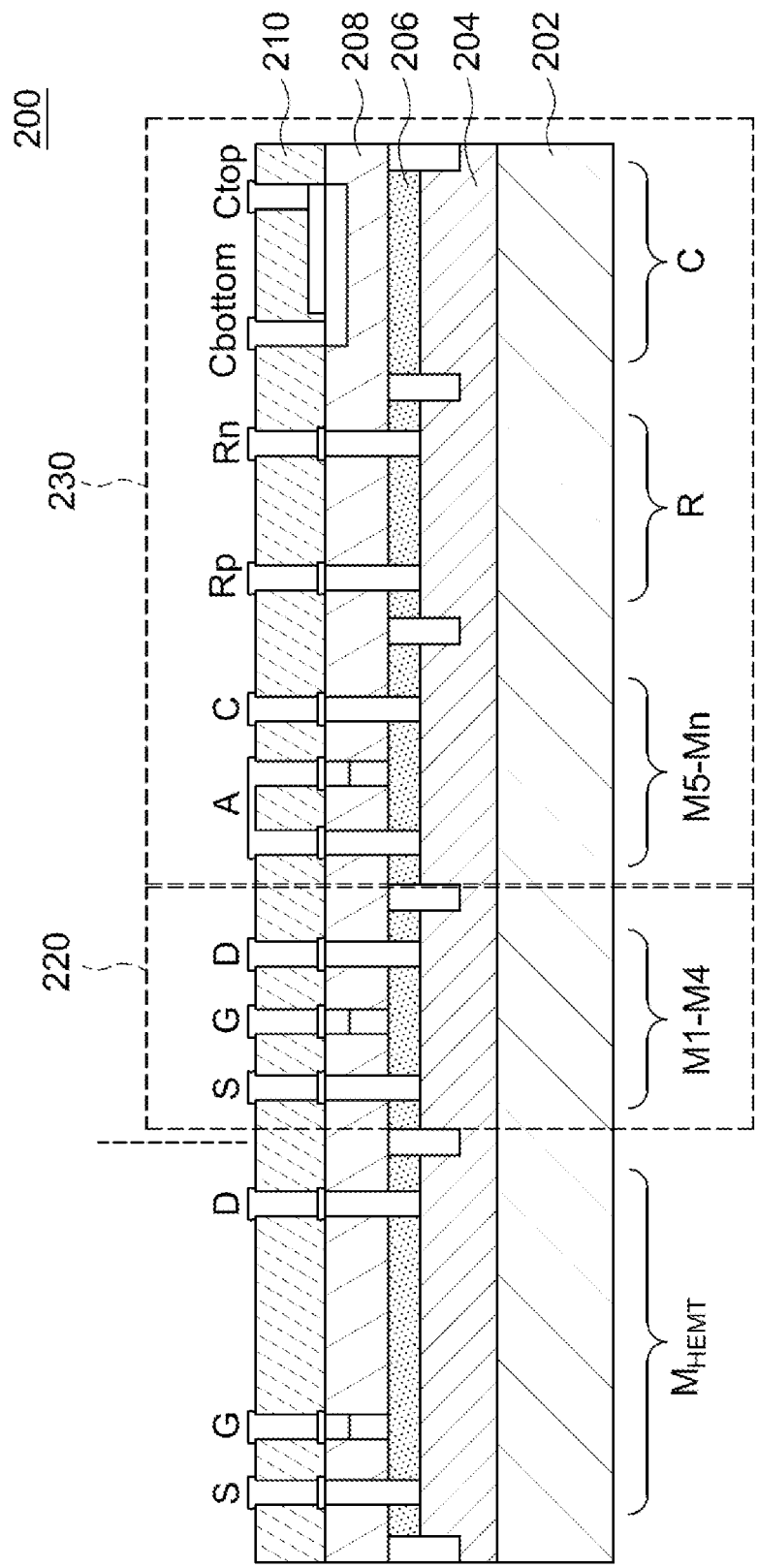
FIG. 2 is a side view of a semiconductor device according to another embodiment of the present invention.

FIG. 2 is a side view of one preferred embodiment of a semiconductor device according to the present invention. A substrate 202, semiconductor layers 204 and 206, and passivation layers 208 and 210 in a semiconductor device 200 of FIG. 2 are similar to the same components in FIG. 1. Compared with the semiconductor device 100 of FIG. 1, the semiconductor device 200 of FIG. 2 is additionally provided with a plurality of transistor structures M1 . . . M4 arranged on the semiconductor layer 206, and a plurality of transistor structures M5 . . . Mn arranged on the semiconductor layer 206 in series. A drain and a gate of each of the transistor structures M5 . . . Mn are connected.

The side view of FIG. 2 only illustrates one of the transistor structures M1 . . . M4. This is because the transistor structures M1 . . . M4 are arranged into one column on the semiconductor device 200 in the present embodiment. In addition, the transistor structures M1 . . . M4 may be arranged near to the GaN transistor $H_{HEMT}$ or near to the transistor structures M5 . . . Mn connected in series.

The side view of FIG. 2 only illustrates one of the transistor structures M5 . . . Mn. This is because the transistor structures M5 . . . Mn are arranged into one column on the semiconductor device 200 in the present embodiment. In addition, the transistor structures M5 . . . Mn may be arranged near to the GaN transistor $M_{HEMT}$ or near to the transistor structures M1 . . . M4.

According to some embodiments of the present invention, the semiconductor device 200 of FIG. 2 further includes a resistor structure R. The resistor structure R includes two terminals Rp and Rn. The resistor structure R may be arranged on the semiconductor layer 206, and is close to the transistor structures M5 . . . Mn, or close to the transistor structures M1 . . . M4.

According to some embodiments of the present invention, the semiconductor device 200 of FIG. 2 further includes a capacitor structure C. The capacitor structure C includes two terminals Ctop and Cbottom. The capacitor structure C may be arranged on the semiconductor layer 206, and is close to the resistor structure R, close to the transistor structures M5 . . . Mn, or close to the transistor structures M1 . . . M4.

According to some embodiments of the present invention, the transistor structures M1 . . . M4 may be used as a switching circuit 220 which is turned on when voltage across the drain structure D and the source structure S of the GaN transistor $H_{HEMT}$ is greater than a threshold, so as to avoid extremely high voltage from damaging the GaN transistor $M_{HEMT}$. According to one preferred embodiment of the present invention, the drain structure D of the GaN transistor $M_{HEMT}$ is electrically connected to the drain of the transistor structure M4, and the source structure S of the GaN transistor $M_{HEMT}$ is electrically connected to the source of the transistor structure M4.

According to some embodiments of the present invention, the transistor structures M5 . . . Mn may be used as a voltage detection circuit 230 configured to detect whether the voltage across the drain structure D and the source structure S of the GaN transistor $H_{HEMT}$ is greater than a preset threshold. When the voltage across the drain structure D and the source structure S of the GaN transistor $M_{HEMT}$ is greater than the preset threshold, the voltage detection circuit 230 would drive the switching circuit 220 to be turned on.

Figure 3:
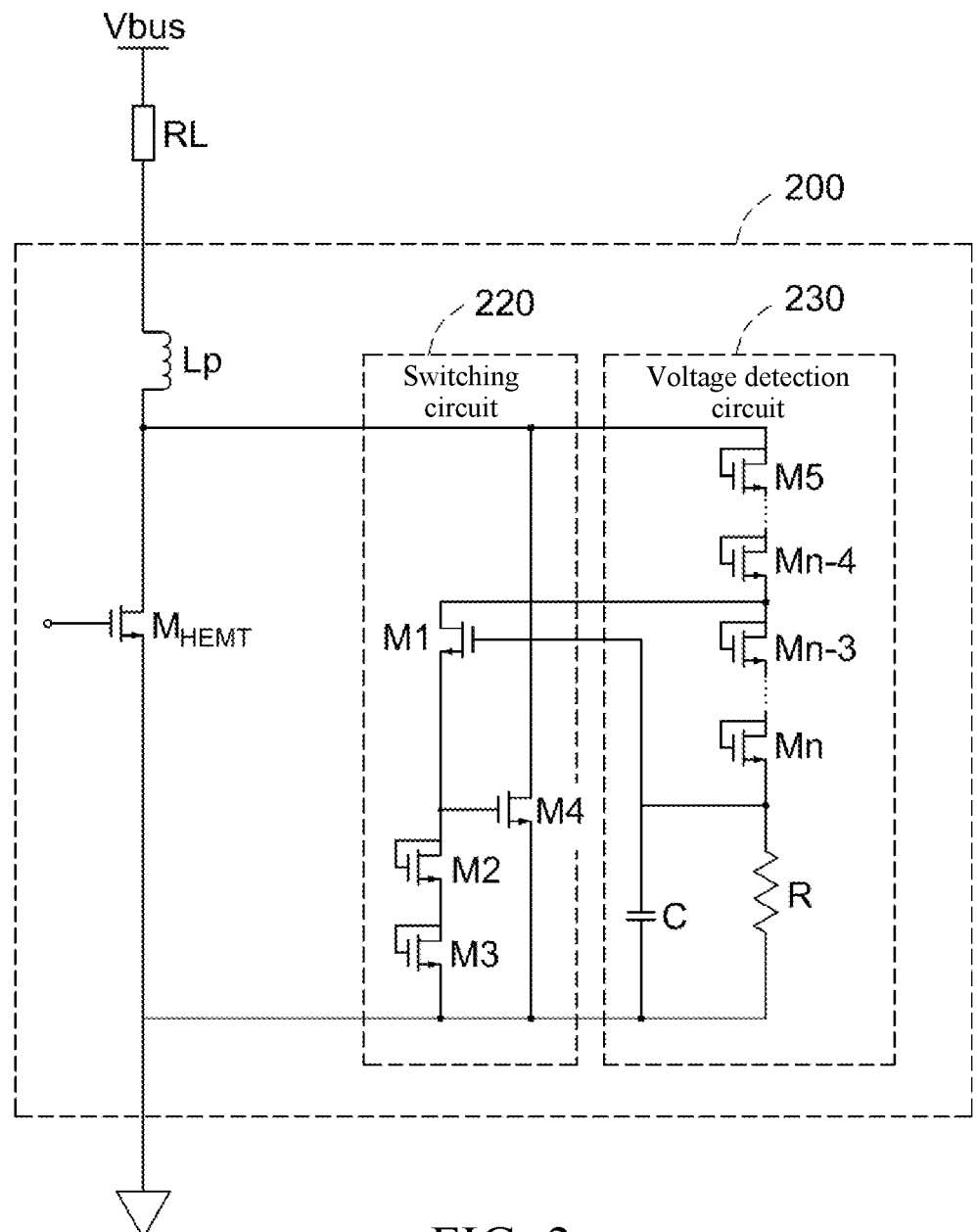
FIG. 3 is a schematic circuit diagram of the semiconductor device of FIG. 2.

FIG. 3 is a schematic circuit diagram of the semiconductor device 200 of FIG. 2. As shown in FIG. 3, the semiconductor device 200 may be connected in series with a load RL to form a power switching circuit. According to some preferred embodiments of the present invention, the semiconductor device 200 includes: the GaN transistor $H_{HEMT}$ and a clamping circuit connected in parallel with the GaN transistor $M_{HEMT}$. The clamping circuit includes: a switching circuit 220 and a voltage detection circuit 230.

If there is no clamping circuit, when the transistor $H_{HEMT}$ is turned off, energy of a parasitic inductor Lp of the transistor $H_{HEMT}$ completely falls onto an equivalent capacitor between the source and the drain of the transistor $M_{HEMT}$. By this time, voltage of the drain would rise, and very easily exceed breakdown voltage of a device, and thus causes damage to the transistor $M_{HEMT}$.

In FIG. 3, the clamping circuit is provided to solve the above problem. The clamping circuit has the switching circuit 220 and the voltage detection circuit 230. The GaN transistor $H_{HEMT}$ is integrated with the switching circuit 220 and the voltage detection circuit 230 on a GaN semiconductor device.

As shown in FIG. 3, the switching circuit 220 includes transistors M1 . . . M4, and the voltage detection circuit 230 includes a plurality of transistors M5 . . . Mn connected in series, a resistor R, and a capacitor C. According to some embodiments of the present invention, n may be, but not limited to, a positive integer greater than 11. According to one preferred embodiment of the present invention, n is equal to 36. On-voltage of the transistors M5 . . . Mn may be expressed as Vth. According to one preferred embodiment of the present invention, external voltage Vbus of the semiconductor device 200 is 40 V, and threshold voltage of the transistors M5 . . . Mn is 1.5 V.

As shown in FIG. 3, the drain and the gate of each of the transistors M5 . . . Mn of the switching circuit 220 are connected. When the voltage of the drain of the GaN transistor $M_{HEMT}$ rises to (n−4) Vth, all the transistors M5 . . . Mn are turned on, and the gate of the transistor M1 is charged, so that the transistor M1 is also turned on. Then, the energy stored in the parasitic inductor Lp flows through the transistors M5 . . . Mn−4 and M1 in the form of a current to charge the gate of the transistor M4, so that the transistor M4 is turned on, and the current is enabled to flow through the transistor M4. When the current flows through the transistor M4, the voltage of the drain of the GaN transistor $H_{HEMT}$ continuously drops until the transistors Mn−3 . . . Mn are turned off, but the transistors M5 . . . Mn−4 are still turned on, so the voltage may be clamped at (n−8) Vth.

In short, when the GaN transistor $H_{HEMT}$ is turned off, the parasitic inductor Lp would release the energy stored therein to enable the voltage of the drain of the GaN transistor $H_{HEMT}$ to rise. When the voltage of the drain of the GaN transistor $H_{HEMT}$ rises to (n−4) Vth, the voltage detection circuit 230 would detect this high voltage and turn on the switching circuit 220. By this time, the energy stored in the parasitic inductor Lp flows through the transistor M4 in the form of a current to achieve discharging. Thereby, the voltage of the drain of the GaN transistor $H_{HEMT}$ continuously drops until it drops to the clamping voltage (n−8) Vth, and the voltage detection circuit 230 turns off the switching circuit 220. By the above clamping circuit, it can be ensured that the voltage of the drain of the GaN transistor $H_{HEMT}$ does not exceed (n−4) Vth in a switching process, so as to protect the GaN transistor $M_{HEMT}$. Therefore, the voltage of the drain of the GaN transistor $M_{HEMT}$ may be effectively avoided from exceeding the breakdown voltage that damages the GaN transistor $M_{HEMT}$.

According to one preferred embodiment of the present invention, if n is equal to 36, and Vth is equal to 1.5 V, the voltage of the drain of the GaN transistor $H_{HEMT}$ will not exceed 48 V, and the clamping voltage will be 42 V. In other words, in the present embodiment, a predetermined threshold for turning on the switching circuit 220 being 48 V and a predetermined threshold for turning off the switching circuit 220 being 42 V would be both greater than operating voltage Vbus of 40 V.

Figure 4:
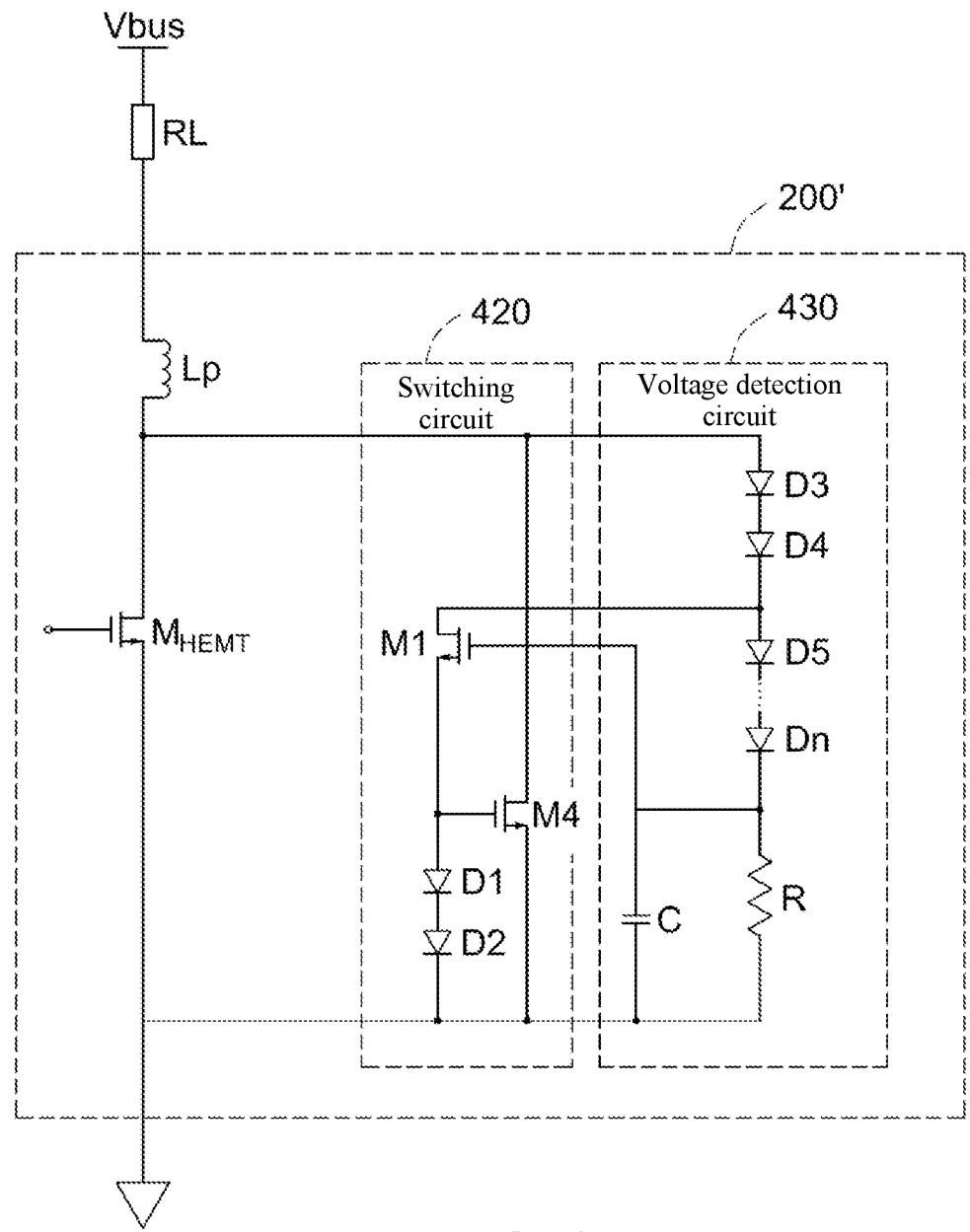
FIG. 4 is a schematic circuit diagram of a semiconductor device according to another embodiment of the present invention.

FIG. 4 is a circuit diagram of a semiconductor device 200' according to another embodiment of the present invention. The semiconductor device 200' may be connected in series with a load RL to form a power switching circuit. According to some preferred embodiments of the present invention, the semiconductor device 200' includes: a gallium nitride (GaN) transistor $M_{HEMT}$ and a clamping circuit connected in parallel with the GaN transistor $M_{HEMT}$. The clamping circuit includes: a switching circuit 420 and a voltage detection circuit 430. The structure of the semiconductor device 200' is similar to that of the semiconductor device 200 of FIG. 3, and a main difference is that the transistors M2 and M3 in FIG. 3 are replaced by diodes D1 and D2, and the transistors M5 . . . Mn are replaced by diodes D3 . . . Dn. Since the gate and the drain of each of the transistors M2, M3 and M5 . . . Mn in FIG. 3 are connected, a diode may be used to replace the transistor of which the gate and the drain are connected.

Figure 5:
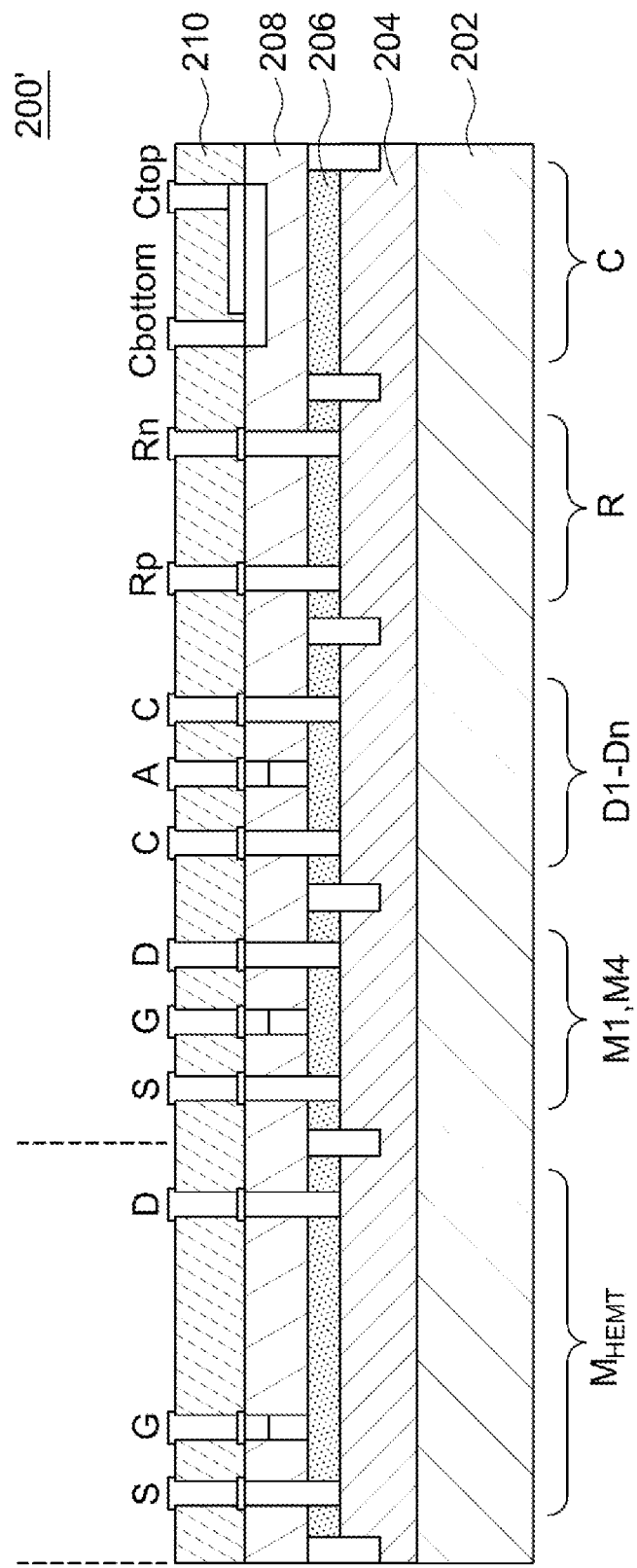
FIG. 5 is a side view of the semiconductor device of FIG. 4.

FIG. 5 is a side view of the semiconductor device 200' of FIG. 4. The semiconductor device 200' of FIG. 5 includes a substrate 202, semiconductor layers 204 and 206, and passivation layers 208 and 210. The semiconductor device 200' of FIG. 5 further includes the GaN transistor $M_{HEMT}$, including a gate structure G, a drain structure D and a source structure S respectively arranged on the semiconductor layer 206. The semiconductor device 200' of FIG. 5 further includes the switching circuit and the voltage detection circuit. The switching circuit includes transistors M1 and M4, and the diodes D1 and D2. The voltage detection circuit includes the diodes D3 . . . Dn, a resistor structure R and a capacitor structure C. Materials and functions of the above components are similar to those of the components having the same numbers in FIG. 2, and descriptions thereof are omitted herein.

Figure 6:
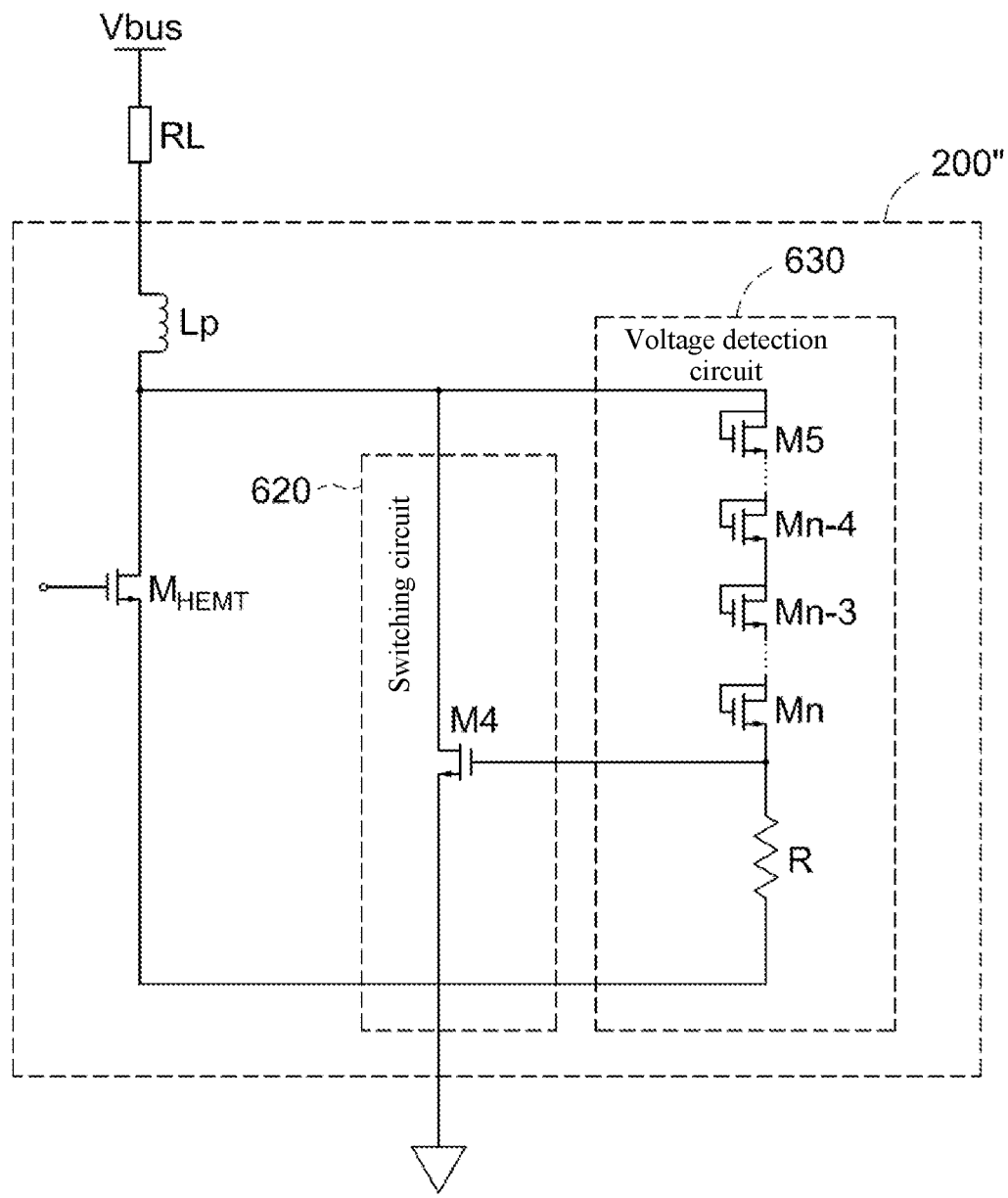
FIG. 6 is a schematic circuit diagram of a semiconductor device according to another embodiment of the present invention.

FIG. 6 is a side view of a semiconductor device 200" according to another embodiment of the present invention. The semiconductor device 200" may be connected in series with a load RL to form a power switching circuit. According to some preferred embodiments of the present invention, the semiconductor device 200" includes: a gallium nitride (GaN) transistor $M_{HEMT}$ and a clamping circuit connected in parallel with the GaN transistor $M_{HEMT}$. The clamping circuit includes: a switching circuit 620 and a voltage detection circuit 630. As shown in FIG. 6, the switching circuit 620 includes a transistor M4, and the voltage detection circuit 630 includes transistors M5 . . . Mn connected in series and a resistor R. A gate and a drain of each of the transistors M5 . . . Mn are connected.

The structure of the semiconductor device 200" is similar to that of the semiconductor device 200 of FIG. 3, and a main difference is that the switching circuit 620 is simplified into a single transistor M4, and a source of the transistor Mn is connected to a gate of the transistor M4. Therefore, when voltage of a drain of the GaN transistor $H_{HEMT}$ rises to (n−4) Vth, all the transistors M5 . . . Mn are turned on, and then the gate of the transistor M4 is charged, so that a current is discharged through the transistor M4. By the above clamping circuit, it can be ensured that the voltage of the drain of the GaN transistor $H_{HEMT}$ does not exceed (n−4) Vth in a switching process, thereby achieving an effect of protecting the GaN transistor $M_{HEMT}$.

Figure 7:
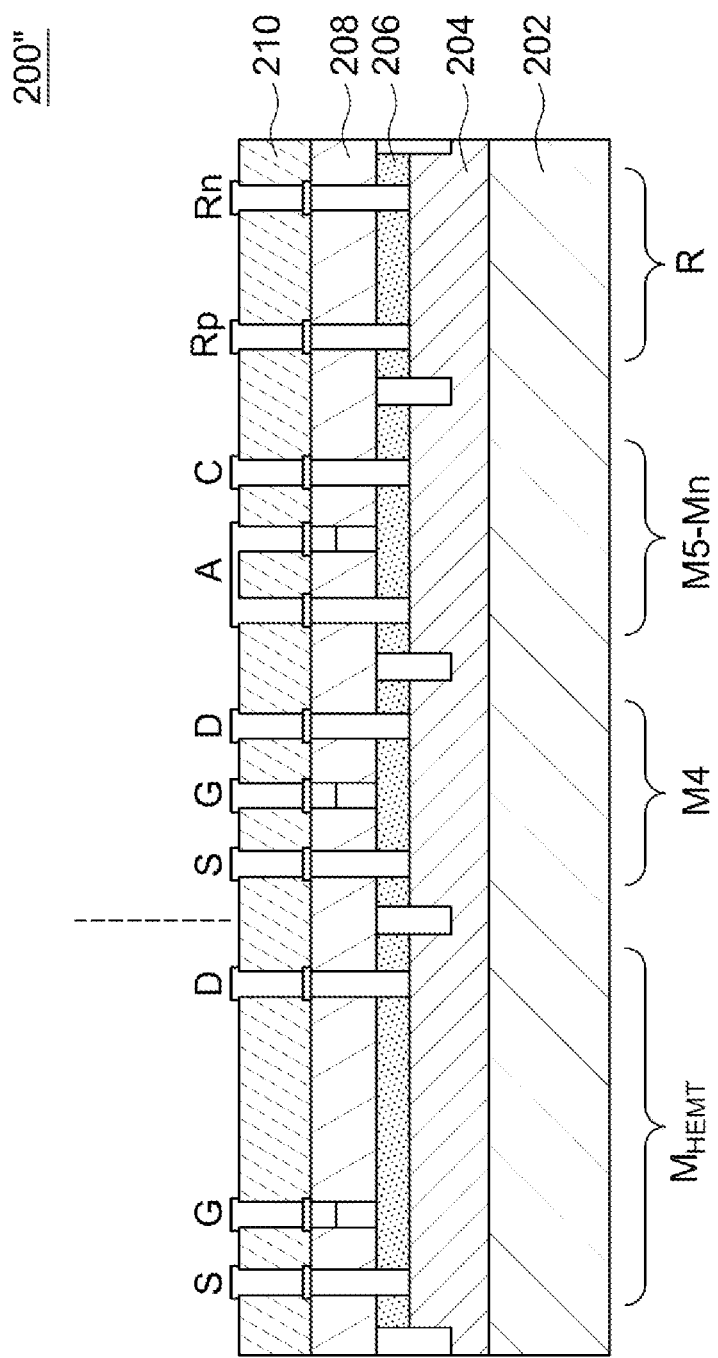
FIG. 7 is a side view of the semiconductor device of FIG. 6.

FIG. 7 is a side view of the semiconductor device 200" of FIG. 6. The semiconductor device 200" of FIG. 7 includes a substrate 202, semiconductor layers 204 and 206, and passivation layers 208 and 210. The semiconductor device 200" of FIG. 7 further includes the GaN transistor $M_{HEMT}$, including a gate structure G, a drain structure D and a source structure S respectively arranged on the semiconductor layer 206. The semiconductor device 200" of FIG. 7 further includes the switching circuit and the voltage detection circuit. The switching circuit includes the transistor M4, and the voltage detection circuit includes the transistors M5 . . . Mn, and a resistor structure R. Materials and functions of the above components are similar to those of the components having the same numbers in FIG. 2, and descriptions thereof are omitted herein.

Figure 8:
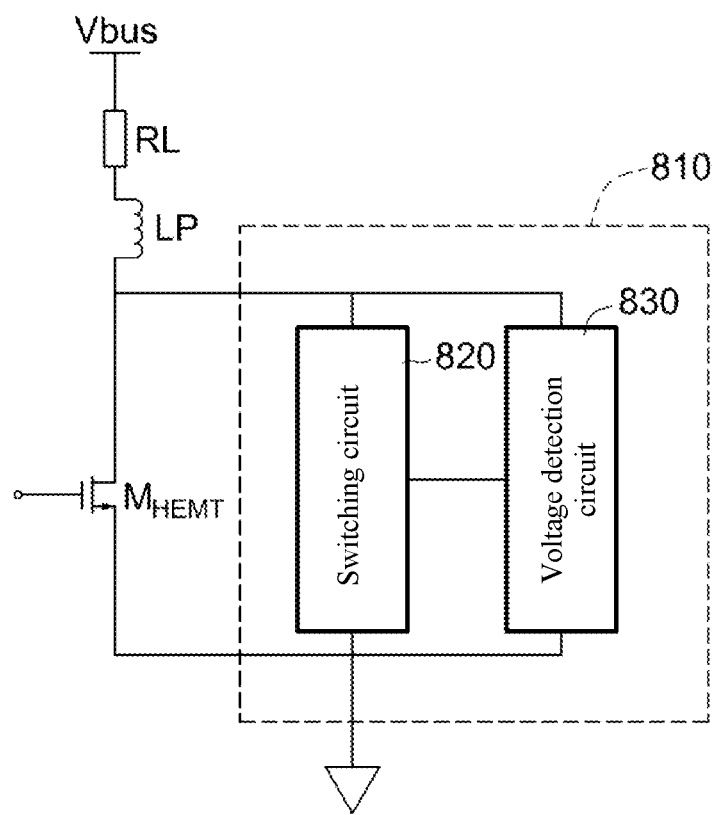
FIG. 8 is a circuit block diagram of some embodiments of a clamping circuit according to the present invention.

FIG. 8 is a circuit block diagram of some embodiments of a clamping circuit according to the present invention. As described in FIG. 8, the clamping circuit may include a switching circuit 820 and a voltage detection circuit 830, so as to protect a power device, such as a gallium nitride (GaN) transistor $M_{HEMT}$. The voltage detection circuit 830 has a first terminal, a second terminal and a third terminal. The voltage detection circuit 830 has a first terminal, a second terminal and a third terminal. A first terminal of the switching circuit 820 and the first terminal of the voltage detection circuit 830 are electrically connected to a first terminal of the power device. A second terminal of the switching circuit 820 and the third terminal of the voltage detection circuit 830 are electrically connected to a second terminal of the power device. A control terminal of the switching circuit 820 is electrically connected to the second terminal of the voltage detection circuit 830. When voltage on the first terminal of the voltage detection circuit 830 is greater than a first threshold, the voltage detection circuit 830 turns on the first terminal and the second terminal of the switching circuit 820 through the control terminal of the switching circuit 820, thereby preventing damage to the power device caused by extremely high voltage on the first terminal of the power device.

According to some embodiments of the present invention, when the voltage on the first terminal of the voltage detection circuit 830 is less than a second threshold, the voltage detection circuit 830 turns off the first terminal and the second terminal of the switching circuit 820 through the control terminal of the switching circuit 820, so that the voltage on the first terminal of the voltage detection circuit 830 is clamped to the second threshold.

The switching circuit 820 and the voltage detection circuit 830 of FIG. 8 may be implemented by the switching circuit 220 and the voltage detection circuit 230 of FIG. 3, may be implemented by the switching circuit 220 and the voltage detection circuit 230 of FIG. 3, may be implemented by the switching circuit 420 and the voltage detection circuit 430 of FIG. 4, and may be implemented by the switching circuit 620 and the voltage detection circuit 630 of FIG. 6. However, those of ordinary skill in the technical art may replace the switching circuit and the voltage detection circuit of the present invention according to the technical spirit of the present invention with reference to the present invention. Therefore, the switching circuit and the voltage detection circuit of the present invention are not limited to the embodiments of FIG. 3, FIG. 4 and FIG. 6.

As used herein, for ease of description, space-related terms such as "under", "below", "lower portion", "above", "upper portion", "lower portion", "left side", "right side", and the like may be used herein to describe a relationship between one component or feature and another component or feature as shown in the figures. In addition to orientation shown in the figures, space-related terms are intended to encompass different orientations of the device in use or operation. An apparatus may be oriented in other ways (rotated 90 degrees or at other orientations), and the space-related descriptors used herein may also be used for explanation accordingly. It should be understood that when a component is "connected" or "coupled" to another component, the component may be directly connected to or coupled to another component, or an intermediate component may exist.

As used in the present invention, terms "approximately", "basically", "substantially", and "about" are used for describing and explaining a small variation. When being used in combination with an event or circumstance, the term may refer to a case in which the event or circumstance occurs precisely, and a case in which the event or circumstance occurs approximately. As used herein with respect to a given value or range, the term "about" generally means in the range of ±10%, ±5%, ±1%, or ±0.5% of the given value or range. The range may be indicated herein as from one endpoint to another endpoint or between two endpoints. Unless otherwise specified, all the ranges disclosed in the present invention include endpoints. The term "substantially coplanar" may refer to two surfaces within a few micrometers (μm) positioned along the same plane, for example, within 10 μm, within 5 μm, within 1 μm, or within 0.5 μm located along the same plane. When reference is made to "substantially" the same numerical value or characteristic, the term may refer to a value within ±10%, ±5%, ±1%, or ±0.5% of the average of the values.

Several embodiments of the present invention and features of details are briefly described above. The embodiments described in the present invention may be easily used as a basis for designing or modifying other processes and structures for realizing the same or similar objectives and/or obtaining the same or similar advantages introduced in the embodiments of the present invention. Such equivalent construction does not depart from the spirit and scope of the present invention, and various variations, replacements, and modifications can be made without departing from the spirit and scope of the present invention.

What is claimed is:

1. A semiconductor device, comprising:
   a first semiconductor layer composed of a III-nitride semiconductor material;
   a second semiconductor layer arranged on the first semiconductor layer and composed of a III-nitride semiconductor material;
   a power transistor structure comprising a gate structure a drain structure and a source structure arranged on the second semiconductor layer;
   one or more first transistor structures (M1 . . . M4) arranged on the second semiconductor layer; and
   one or more second transistor structures (M5 . . . Mn) arranged on the second semiconductor layer in series,
   wherein one end of the one or more first transistor structures (M1 . . . M4) and one end of the one or more second transistor structures (M5 . . . Mn) are jointly electrically connected to the drain structure of the power transistor structure, and the other end of the one or more first transistor structures (M1 . . . M4) and the other end of the one or more second transistor structures (M5 . . . Mn) are jointly electrically connected to the source structure of the power transistor structure;
   wherein the one or more first transistor structures (M1 . . . M4) are used as a switching circuit, the one or more second transistor structures (M5 . . . Mn) are used as a voltage detection circuit, the switching circuit and the voltage detection circuit together are used as a clamping circuit being connected in parallel with the power transistor structure and being connected between the drain structure and the source structure of the power transistor structure.

2. The semiconductor device according to claim 1, wherein the one or more first transistor structures (M1 . . . M4) is or are arranged close to the power transistor structure.

3. The semiconductor device according to claim 2, wherein the one or more second transistor structures (M5 . . . Mn) is or are arranged close to the one or more first transistor structures (M1 . . . M4).

4. The semiconductor device according to claim 1, wherein the one or more second transistor structures (M5 . . . Mn) is or are arranged close to the power transistor structure.

5. The semiconductor device according to claim 1, wherein the one or more first transistor structures (M1 . . . M4) is or are arranged close to the one or more second transistor structures (M5 . . . Mn).

6. The semiconductor device according to claim 1, further comprising: a resistor structure, arranged on the second semiconductor layer and close to the one or more second transistor structures (M5 . . . Mn).

7. The semiconductor device according to claim 6, further comprising: a capacitor structure, arranged on the second semiconductor layer and close to the resistor structure.

8. The semiconductor device according to claim 1, further comprising: a passivation layer, arranged on the second semiconductor layer.

9. The semiconductor device according to claim 1, wherein the drain structure of the power transistor structure is electrically connected to a drain of the one or more first transistor structures (M1 . . . M4), and the source structure of the power transistor structure is electrically connected to a source of the one or more first transistor structures (M1 . . . M4).

10. The semiconductor device according to claim 1, wherein the drain structure of the power transistor structure is electrically connected to a drain of the one or more second transistor structures (M5 . . . Mn), and the source structure of the power transistor structure is electrically connected to a source of the one or more second transistor structures (M5 . . . Mn).

11. The semiconductor device according to claim 1, wherein the switching circuit is turned on when a voltage across the drain structure and the source structure of the power transistor structure is greater than a threshold, and the voltage detection circuit is used to drive the switching circuit to be turned on when the voltage detection circuit detects that the voltage across the drain structure and the source structure of the power transistor structure is greater than the threshold.

* * * * *